United States Patent [19]

Anger et al.

[11] Patent Number: 5,185,771

[45] Date of Patent: Feb. 9, 1993

[54] PUSHBROOM SPECTROGRAPHIC IMAGER

[75] Inventors: Clifford D. Anger; Stephen K. Babey, both of Calgary, Canada

[73] Assignee: Itres Research Limited, Calgary, Canada

[21] Appl. No.: 552,195

[22] Filed: Jul. 13, 1990

[51] Int. Cl.⁵ .................. G11C 19/28; H01L 29/78
[52] U.S. Cl. .................................. 372/60; 257/215
[58] Field of Search .................. 357/24; 377/57–63

[56] References Cited

U.S. PATENT DOCUMENTS

| | | | |
|---|---|---|---|
| 4,567,524 | 1/1986 | Levine | 357/24 |
| 4,585,934 | 4/1986 | French et al. | 357/24 |
| 4,758,895 | 7/1988 | Elabd | 357/24 |
| 4,803,710 | 2/1989 | Elabd | 357/24 |
| 4,862,487 | 8/1989 | Ando et al. | 357/24 |
| 4,870,293 | 9/1989 | Elabd | 357/24 |

Primary Examiner—Gene M. Munson

Attorney, Agent, or Firm—Millen, White, Zelano and Branigan

[57] ABSTRACT

The Charge Coupled Device ("CCD"), which is an integrated circuit array sensor in "chip" form, of a pushbroom spectrographic imager is operated to achieve fast dumping of unwanted rows of charges. The chip is provided with antiblooming structure in the image area and the first row of the storage area. The rows of charges are divided into groups of several rows. The groups of interest (i.e. the active groups) and those that are not wanted (i.e. the discard groups) are so designated. The rows in each group are summed in the antiblooming structure of the storage area. The active summed rows are sequentially transferred by the chip's transport register to an output amplifier, wherein the individual charges are read out and digitized to yield signal values for collection. The discard summed rows are cleared without digitization.

9 Claims, 8 Drawing Sheets

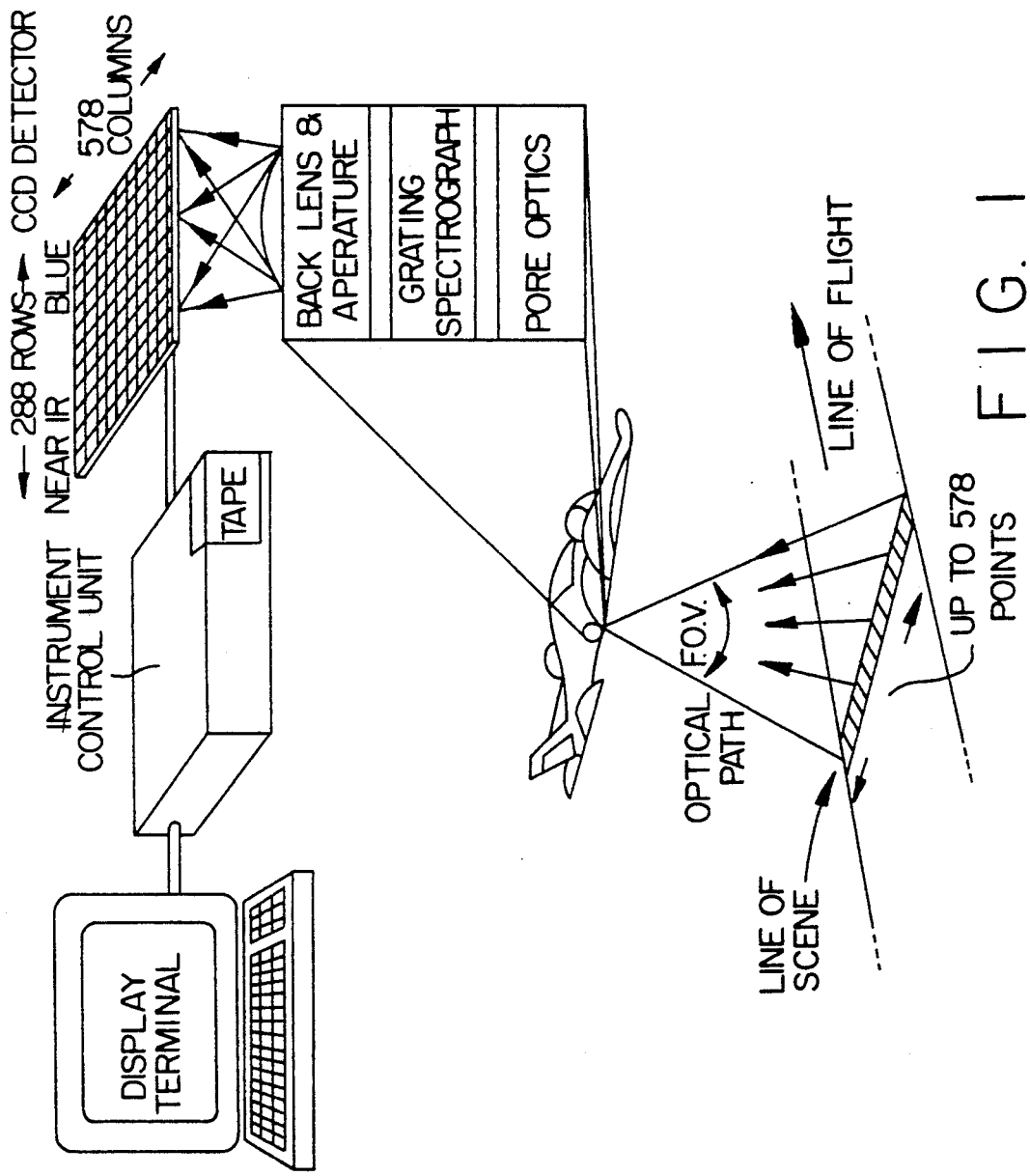

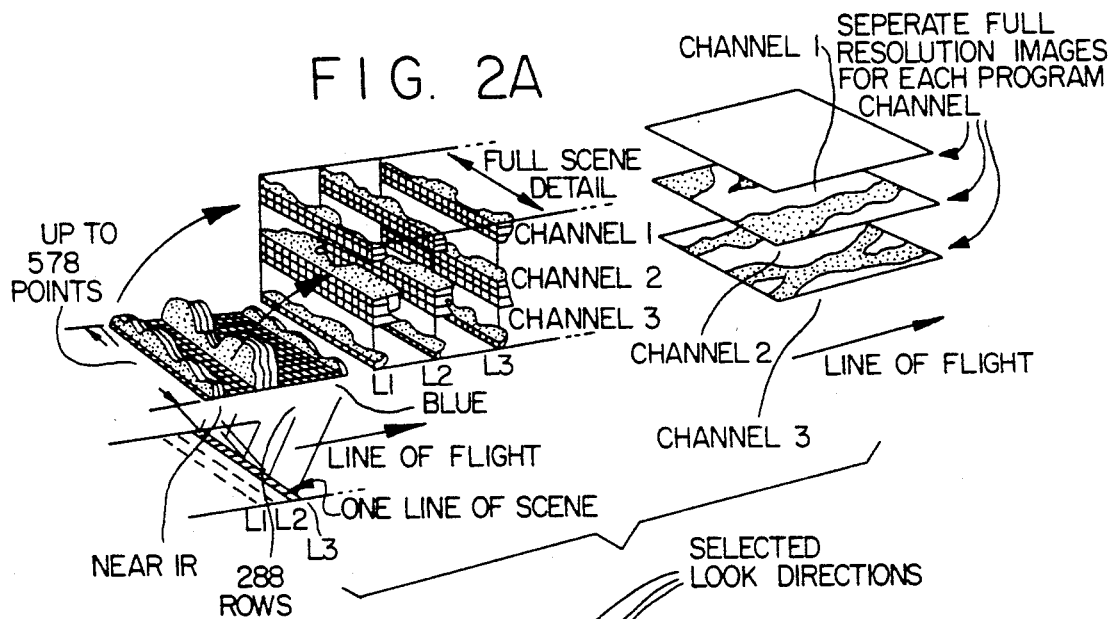
FIG. 2A
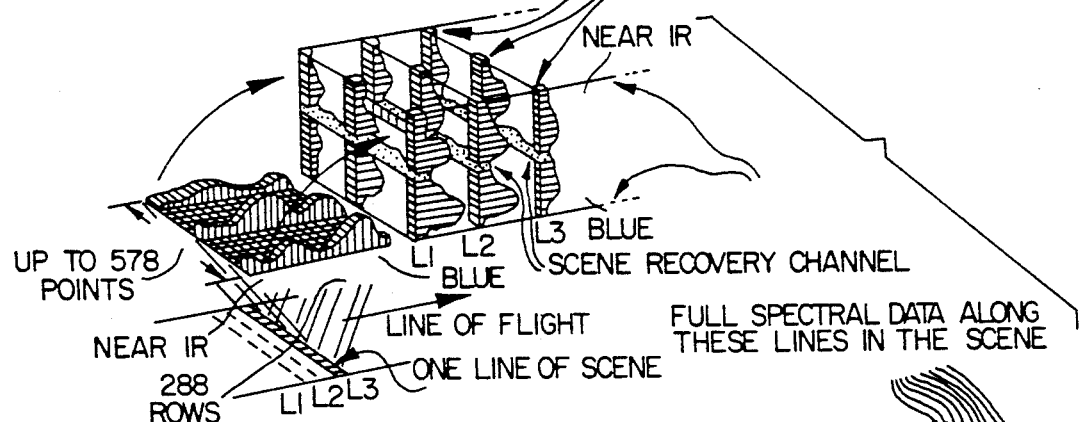
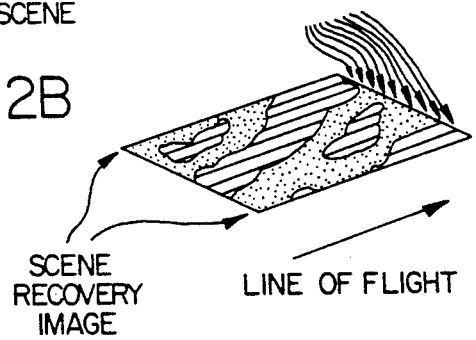
FIG. 2B

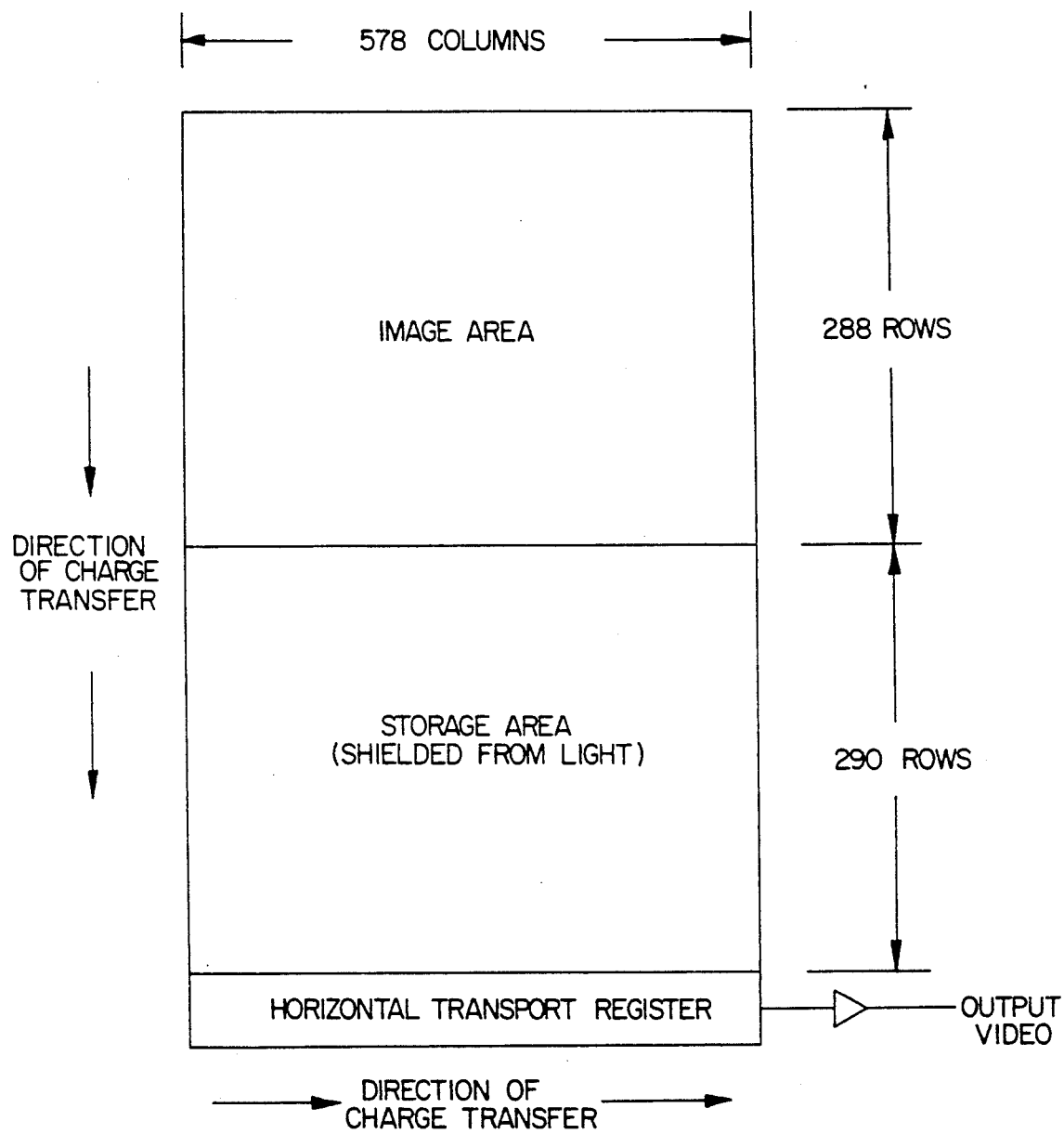
F I G. 5

PUSHBROOM SPECTROGRAPHIC IMAGER

FIELD OF THE INVENTION

The present invention relates to improvements in the operation of a two dimensional charge transfer sensor, to adapt it for use in a pushbroom spectrographic imager for acquiring visible and near infrared imagery in digital form. More particularly, it relates to a method for rapidly clearing unwanted rows of charges from the sensor, so that wanted rows can be more quickly read out and digitized.

BACKGROUND OF THE INVENTION

The invention has been developed in conjunction with improvement of a pushbroom spectrographic imager. Such an imager is described in Canadian Special Publication of Fisheries and Aquatic Sciences 83: "Analysis of Test and Flight Data from the Fluorescence Line Imager", Dept. of Fisheries and Oceans, Ottawa, 1985.

The aforesaid imager was developed by a group including the present assignee. It was designed for airborne operation, although its application is not limited to that field.

In general, having reference to FIG. 1, the imager comprises:
a transmission grating spectrograph, having an objective lens, a slit assembly, a collimator lens, a reflection diffraction grating, and a camera lens;
a two dimensional charge transfer sensor, such as a Charge Coupled Device ("CCD") integrated circuit array sensor chip, operatively coupled with the spectrograph through a horizontal transport register within the chip, to an output amplifier for digitizing the sensor output; and an instrument control unit for operating the spectrograph and sensor and collecting the output from the amplifier.

The spectrograph functions to focus the light from the scene being viewed onto the slit and to disperse and reimage the light from each point in the line image formed on the slit. Therefore the output of the spectrograph presents a series of line images displaced orthogonally from one another, each line representing a single distinct wavelength of light.

In use, the imager is flown over a narrow, elongated strip of terrain or a "scene" that is to be imaged. The sensor is adapted to be momentarily exposed to light reflected from a discrete narrow strip or "swath" (say 4 m×1500 m), usually extending along a line transverse to the direction of flight. The sensor is sequentially exposed to the reflected light emanating from one swath after another. The charges generated in the sensor are read out, digitized and recorded to yield the desired information from the scene as a whole.

More particularly, the sensor head is positioned with the objective lens oriented downwards so that the radiation from the strip is imaged onto the spectrograph slit. Reflected light emerging from the slit is collimated and then dispersed by a diffraction grating. The beam is then focused by the camera lens onto the image or "active" area of the CCD chip.

The CCD chip heretofore used in applicant's imager was a thermoelectrically cooled P86520 series frame charge transfer device manufactured by EEV Inc. (Chelmsford, U.K.). The chip active area comprises a rectangular pattern in rows and columns of pixels (each 15×22 micrometers). The pixels are light sensitive silicon. The CCD chip active area is oriented to obtain 578 pixels of spatial resolution across the flight path. The spectrum is dispersed along the columns of the CCD active area, to provide 288 spectral resolution elements, each 1.8 nm wide and covering the spectral range from 430-870 nm. The format of the CCD chip is illustrated in FIG. 2.

In summary then, when integrated with the spectrograph, each row of pixels generates charges indicative of the intensity of radiation having a particular wavelength, said radiation being reflected from a linear array of terrain elements forming a swath of the scene being imaged. And each column of pixels generates charges indicative of the spectrum of an individual element.

A further 290 rows and 578 columns of pixels are provided on the chip and constitute a storage area that is shielded from the light. The columns and rows of the storage area extend on with the same pattern from one end of the active area.

The chip further comprises a horizontal transport register located at the far end of the storage area.

With such chips, the charges of each row of pixels can be transferred to a neighbouring row of pixels by application of external control signals. Stated otherwise, the rows of charges present in the active area pixels may be sequentially advanced through the storage area and transferred, one row at a time, by the register to the output amplifier, for reading and conversion into digitized output or for disposal.

Now, in order to achieve a given resolution from a moving aircraft employing the imaging spectrograph, it is necessary to read out and store all of the charge data from a given exposure in the time it takes for the aircraft to move forward by an amount equal to the distance (the width of the swath) to be resolved on the ground. For example, if the aircraft ground speed is 100 meters per second and the desired ground resolution is 2 meters, then the entire readout has to be completed in 1/50 second.

Since all of the charge has to be cleared from the CCD chip after each exposure, the previous technique of shifting out the individual charges one row at a time, consistent with the transfer rate of the horizontal transports register, results in excessively long readout times. For example, a typical CCD with more than 200,000 pixels, if read out at one microsecond per pixel, would require 1/5 second to digitize all the pixels.

With this background in mind, there is therefore a need for an improved system for reading out the chip to increase the rate with which it processes the charges arising from one exposure, so that good resolution can be achieved even when advancing at typical aircraft speed.

SUMMARY OF THE INVENTION

According to one aspect of the invention, the rows of charge in a charge transfer sensor, such as a CCD chip, are divided into groups or bands of several adjacent rows of charges. More particularly, a selection is made, by the operator through the means of software in the control unit, with respect to these groups. Wanted groups of interest are designated for digitization. The balance of the groups, being unwanted, are designated for clearing without digitization. Each wanted group of rows of charges is summed in the chip to produce what we refer to as an active summed row of charges. These active summed rows are sequentially transferred by the register to the output amplifier to be digitized to yield signals to be collected and used. The unwanted rows are cleared or "dumped" from the chip without digitization. This is preferably accomplished by summing in the chip each group of unwanted rows to produce what we refer to as a discard summed row of charges. These discard summed rows are preferably transported by the register into the output amplifier, from which they are cleared without digitization.

The majority of the groups contain 5-100 rows of charges. The word "several" is intended to denote this range.

From the foregoing, it will be understood that the essence of this aspect of the invention is directed toward fast readout of the chip and involves:

dividing and designating the rows into groups of adjacent active rows and adjacent discard rows, the majority of the groups each having several (5-100) rows;

summing each group of active rows on-chip, to produce a single active summed row;

digitizing the active summed rows; and quickly clearing the balance of the rows (the discard rows) from the sensor without digitizing them, preferably by summing each group of discard rows on-chip and transferring the produced discard summed row to the amplifier for clearing without digitization.

In this manner, the number of charges being digitized has been greatly reduced and the time taken to process each exposure is reduced.

In a preferred form of the invention, we utilize a CCD chip having antiblooming capability, to enable summation of several adjacent rows of charges without overflow.

At this point, it is appropriate to elaborate on 'antiblooming'.

A CCD, when subjected to excessive amounts of light in a given pixel will build up charge in that pixel which exceeds the capacity of the structure designed to confine it. The excess charge will bleed into adjacent pixel sites occupying the same column. This contamination results in an incorrect estimate of the level of illumination of the pixel(s) affected by this "blooming". In normal imaging situations the saturated pixels aligned along columns are readily apparent. The saturated pixels will produce large output levels evidencing their saturated condition and one would expect to see contaminated signal levels in adjacent pixels along the same column. However, in an imaging spectrograph of the type described herein, in which only specific spectral bands are digitized and stored, the effects of blooming may not be evident. If charge saturation and blooming occurs in an area on the array which is not being digitized, charge may bloom into unsaturated regions which are being digitized and contaminate signal levels there in a manner which is unrecognizable in the recorded data.

To avoid this problem we preferably employ an "antiblooming CCD" in which overflow charge is removed directly and prevented from blooming along the column in which it is produced. Antiblooming capability can be achieved by creating special structures in the CCD itself, using techniques developed by CCD manufacturers and embodied in their commercial products, or by special clocking techniques as described recently by J. Janesick of the Jet Propulsion Laboratory in a distributed memo entitled "Anti-Blooming Protect Mode for CCD", dated Apr. 23, 1990. With employment of antiblooming, exposure times can be optimized for the particular spectral bands of interest without concern for contamination by charge from portions of the spectrum, whether included in the selected bands or not, which may be saturated.

As already stated, we achieve further improvement of the readout rate and corresponding ground resolution by employing a technique of "fast charge dumping", which disposes of the charge from groups or bands of adjacent rows in a single step. This can be done in several ways employing specially constructed sensor arrays, which allow random addressing of rows or which employ special addressable charge dumping drains on the horizontal transport register. The current technique we use employs antiblooming structures such as are present in the top row of the storage area in the EEV model CCD04-06-02 antiblooming CCD. The antiblooming structure is an implant that provides an escape route for excess charge into the substrate of the chip, preventing charge from accumulating in individual pixels to the point where it will overflow the potential barriers which define and separate the individual pixels. The antiblooming structures act to prevent blooming regardless of whether the charge results from exposure to light or by transfer (summing) of charges from adjacent rows. By shifting rows into the CCD storage area without any simultaneous shifting within the storage area, charge builds up and overflows into the antiblooming structures in this top row. Any number of unwanted rows (between spectral bands) can be summed in this way resulting in only a single row of charges needing to be disposed of in the normal way. Once the unwanted rows have thus been disposed of the charges in the storage area are preferably shifted down by a few rows to leave a "guard band". Charges from the rows constituting a spectral band are then summed into the top row of the storage area. Once this has been accomplished another guard band is created by again shifting down the rows in the storage area. The process can then be repeated for the next set of unwanted rows and/or spectral bands until the entire CCD has been read out. Then the summed rows and the guard bands are transferred one row at a time into the horizontal transport register and cleared or digitized as appropriate (except that the unwanted row charges and the surrounding guard bands can be summed into the horizontal transport register prior to being cleared). By this means the readout time is significantly decreased, typically by a factor of two or more.

The guard bands are desirable because at high output levels the antiblooming structures may not have the current carrying capacity to handle multiple rows of charge being transferred in at high rates during the charge dumping process and some charge may overflow somewhat into an adjacent row or rows. Leaving the guard bands prevents mixing of this overflow charge with the charge from the spectral bands.

In summary:

By providing antiblooming capability in the CCD;

By summing individual groups of active rows and individual groups of discard rows in the antiblooming section, to create a lesser number of summed rows in the storage area;

By transporting the active summed rows to the output amplifier and digitizing them to produce output suitable for feeding to the data recording means; and By clearing the discard summed rows without digitizing them;

the processing speed of the instrument has been advantageously increased.

In another aspect of the invention, we provide a method for operating the chip whereby both spatial and spectral information may be derived simultaneously from a single exposure of the chip.

By way of background, in an imaging spectrograph digitizing and storing the data for all spectral elements from each spatial element in the swath would require enormous data volumes and rates and would result in frame rates too slow to be practical in many situations. To avoid these difficulties a flexible scheme is employed whereby selected rows and columns of charges (or parts thereof) are designated as active and the balance as discard. The active rows and columns are transferred to the output amplifier and digitized to yield data representing a combination of spectral and spatial line images (as illustrated in FIG. 2). This is done by shifting part or all of the active row of charges through the amplifier and digitizing them. This ensures that those charges of the row, that correspond with the columns to be digitized, are in fact digitized and collected. The balance of the rows are also transferred to the amplifier but only the charges in each such row that correspond with the columns to be digitized are in fact digitized and collected. It may be that all of the charges of the column are digitized in this fashion, or only some of them are. The rest of the charges of the rows are cleared and not digitized. As a result of the foregoing, both a spatial row or rows of charges are digitized and collected in whole or in part and a spectral column or columns of charges are digitized and collected in whole or in part. Preferably, groups of several adjacent rows and columns are designated as active, summed on-chip as previously described, and the active summed rows and columns are digitized. The charges from the discard rows and columns of the unwanted regions of the array are cleared without digitizing. In a most preferred embodiment, the discard rows and columns are also summed and the summed discard rows and columns are cleared without digitization, thereby achieving faster readouts and reduced data quantities.

Stated otherwise, we have implemented an enhanced readout scheme which combines the spectral mode readout with the readout of a selected row to give a high resolution image at a user-specified wavelength, with very little additional overhead in terms of data quantities or rates. In this way the spectral sequences from each look direction appear as exactly registered lines in a full-resolution image of the scene being scanned making it possible to determine the spectra associated with specific objects such as trees, grasslands, water bodies and the like.

Implementation of the scheme involves switching programs in the MCU when the specified row is reached and, during post processing, inserting the measured values from the "scene recovery image" for the appropriate columns into the gaps in the spectra resulting from the full row readout.

DESCRIPTION OF THE DRAWINGS

FIG. 1 is a fanciful illustration showing the scheme of the airborne imager;

FIG. 2 is a fanciful illustration showing the nature of the information derived from use of the instrument utilizing the scene recovery image feature;

FIG. 5 is a schematic of the sensor chip;

DESCRIPTION OF THE PREFERRED EMBODIMENT

General Description

Figure 3:
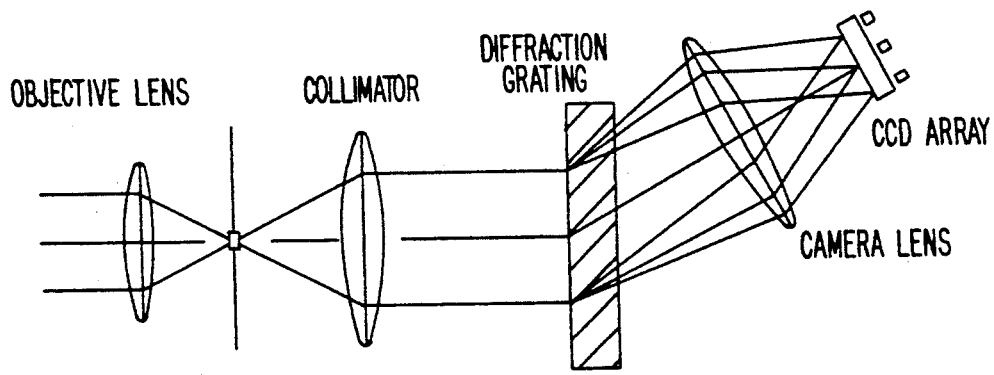
FIG. 3 is a schematic showing the main components of a sensor head of a pushbroom spectrographic imager.
Figure 4:
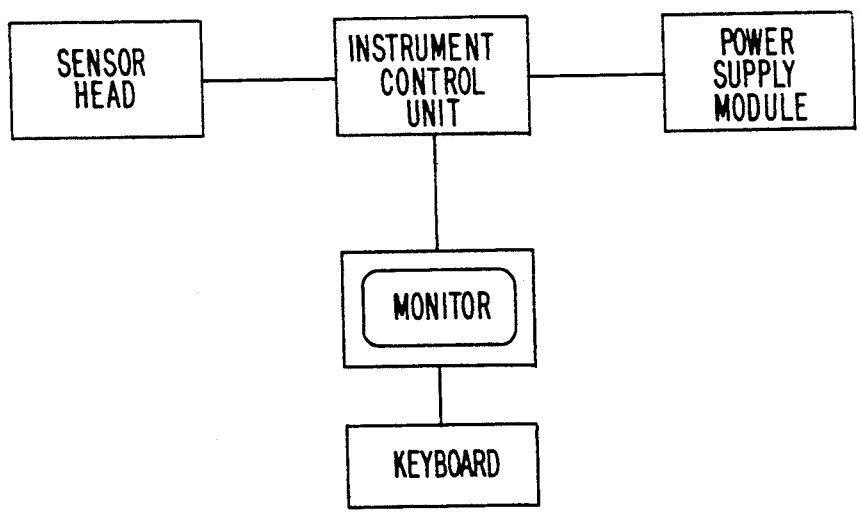
FIG. 4 is a block diagram showing the components of the entire imager instrument.

The CCD readout subsystem, shown in FIG. 4 implements the fact charge dumping/antiblooming and scene recovery channel invention. The human operator specifies to a computer via keyboard input which rows of the CCD sensor are to be summed together to form active summed rows. The computer then converts this information into a sequence of instructions that are stored in a programmable timing generator. During the integration time, light incident on the CCD sensor is converted into hole-electron pairs and electrons are accumulated in charge collection regions or pixels at discrete locations within the CCD sensor. When the exposure interval has elapsed, the programmable timing generator cycles through the set of instructions as defined by the computer. These instructions are decoded to generate a sequence of control signals which operate clock drivers. The clock drivers convert the control signals to voltage levels required to actuate the vertical and horizontal clock phases and gates of the CCD to effect transfer of the charge packet for each pixel through the intervening pixel sites and to the output amplifier in the desired manner. The analog signal processing amplifies and conditions the video output signal so that each summed pixel can be converted to a digital number representing the magnitude of its charge packet by the analog-to-digital converter.

The current implementation of each CCD readout subsystem component is described in the following sections, and the current method of using this apparatus to effect the invention is then described.

Computer

The computer is a single board type MICRO-PC designed by Faraday Computer Corp. and manufactured by Diversified Technology Inc. Insofar as the computer merely functions to accept human operator input for the selection of CCD rows to be summed into active and discard rows, and to convert said input into a series of instructions for the programmable timing generator, the computer type is not critical and may be of any general purpose type ranging from a microcomputer to a mainframe.

Programmable Timing Generator

The programmable timing generator controls the exposure and readout of the CCD by manipulation of electrical signals driving the clock phases and gates of the array. It should be noted that the programmable timing generator is not necessarily required as its functions can be performed by the computer. However, in this implementation, a separate microprogrammable control unit ("MCU") is used because the desired high speed of operation is difficult to achieve with currently available general purpose computers.

Figure 7:
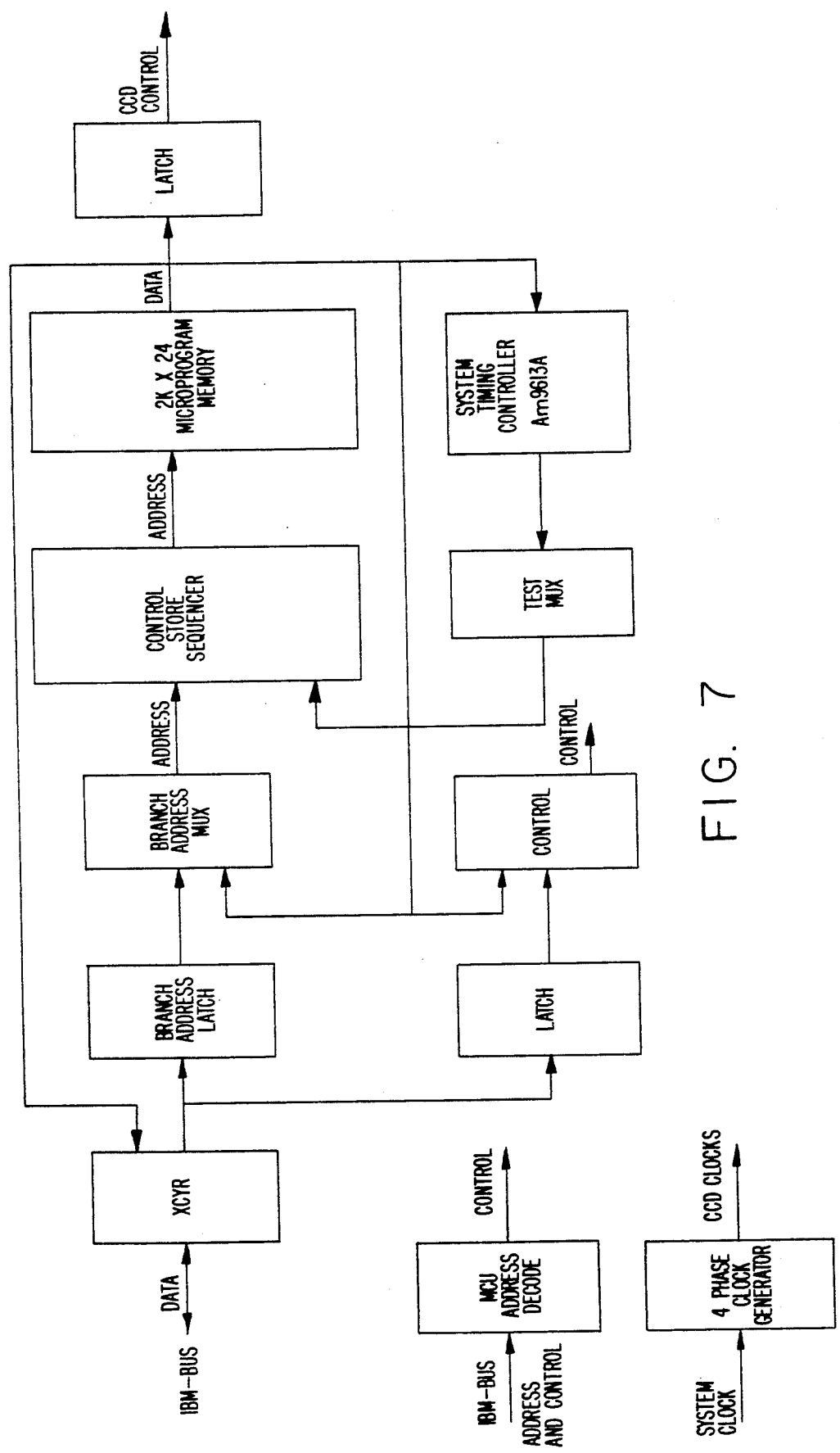
FIG. 7 is a block diagram showing the components of the microprogrammable control unit ("MCU")
Figure 8:
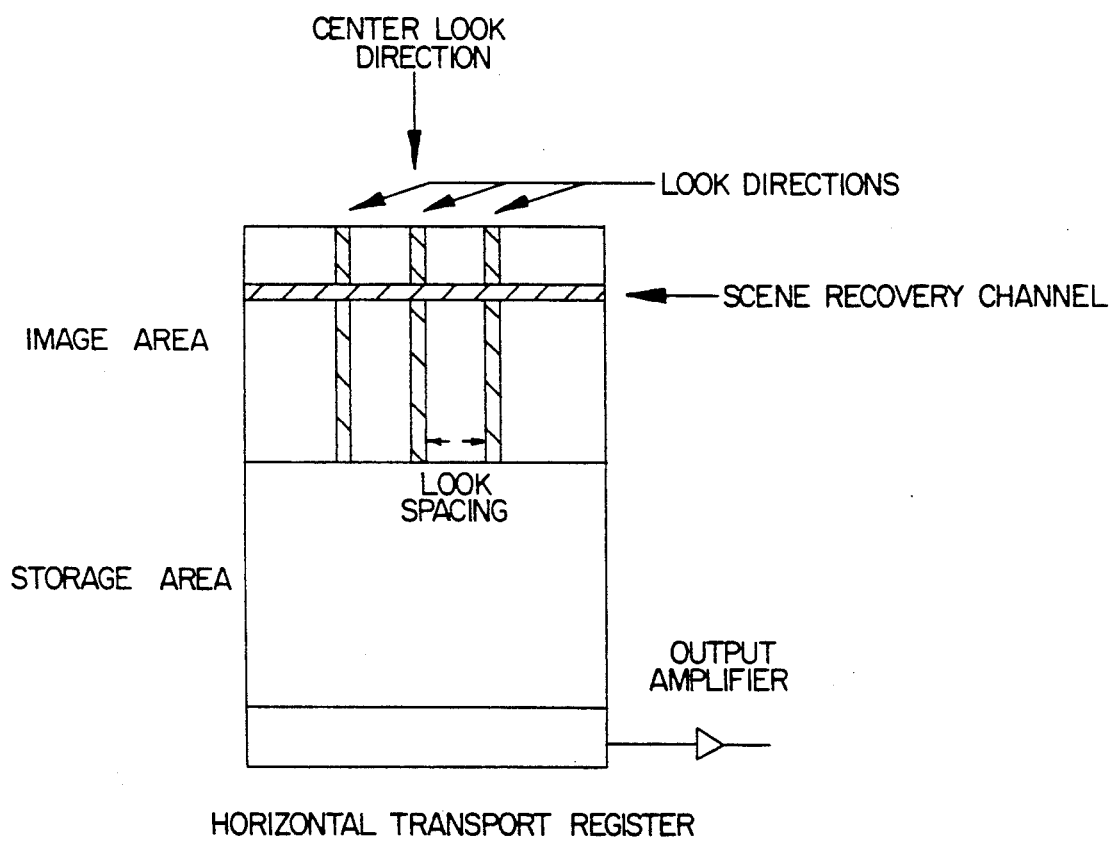
FIG. 8 is a schematic fancifully illustration of the chip developing both spatial and spectral image rows of charges.
Figure 9:
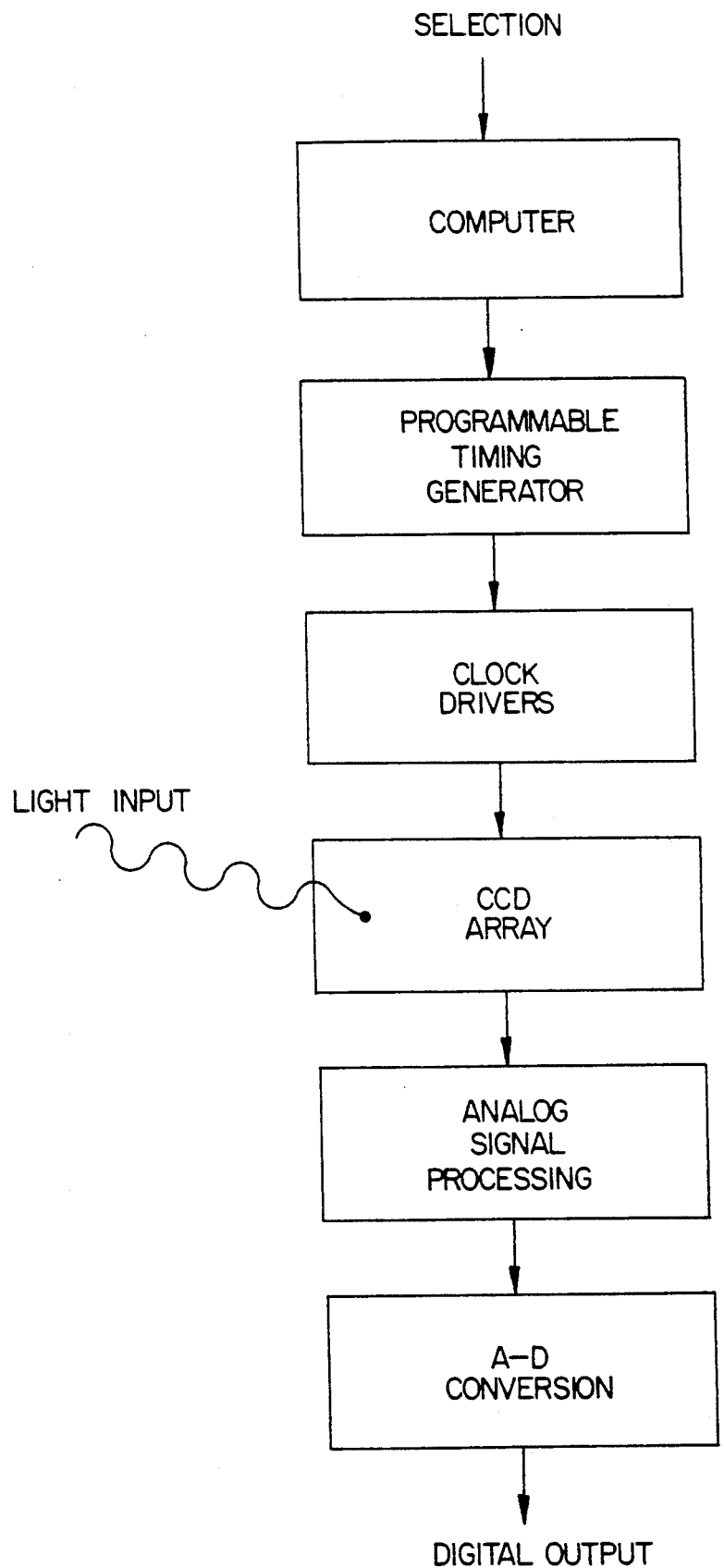
FIG. 9 is a self-explanatory flowsheet of the operation of the invention from selection to digital output.

A block diagram of the MCU is shown in FIG. 7. The MCU is a type of circuit known as a microprogrammed sequencer. It contains a 2K×24 bit writable control store (microprogram memory) which is loaded by the computer with microinstructions. A control store sequencer (Signetics 8×02) fetches microinstructions from microprogram memory one at a time and executes them. A set of 5 counters (AMD Am 9513A) can be used to perform looping and exposure timing. Certain bits in the microinstruction field are allocated as CCD control bits which are connected to the clock drivers. In this way the MCU generates the timing sequence of the electrical signals driving the CCD to implement the invention.

It should be noted that the programmable timing generator is not required to be a design of the type described herein, because there are many well-known techniques for producing the programmable waveforms to control the CCD, such as state machines, microcontrollers and RAM/EPROM based sequencers.

Clock Drivers

The clock drivers serve to convert the logic-level control signals from the programmable timing generator into the MOS voltage levels required by the CCD. They have high current drive capability due to the high capacitance of the CCD clock phases. The current implementation uses the ESB365089AA and ESB3650-90AA clock driver hybrids manufactured by EEV Inc., Chelmsford, U.K. The clock drivers may be implemented in other well-known ways, such as discrete transistors.

CCD Array

The current implementation uses the CCD04-06-02 Charge Coupled Device (CCD) image sensor manufactured by EEV Inc., Chelmsford, U.K. (although the system can use other types of charge transfer sensors). This is a 3-phase frame transfer device with a resolution of 578 columns×288 rows of pixels, each pixel having dimensions of 15×22 microns. The device incorporates antiblooming drains in the image area.

The sensor configuration is shown in FIG. 5. In the standard prior art mode of operation, such as seen in television applications, an optical image is focused onto the image area for a certain integration time (typically about 1/60 sec). During this period the incident radiation generates photoelectrons which are accumulated in the potential wells corresponding to each pixel site. Column to column isolation is maintained through a barrier implant between each column. Row-to-row isolation is maintained by the potential profile produced by the three image area clock phases.

At the end of the integration time the charge contained in the image area and storage area clock phases. A total of 290 clock pulses are required to transfer all of the charge from the image area to the storage area. The storage area is then shifted one row at a time into a horizontal transport register which in turn is shifted one column at a time to an output amplifier where the charge for each pixel is converted to a voltage proportional to the magnitude of its charge. The next integration time commences after the frame transfer into the storage area has taken place.

In the present method the prior art mode described above is not used, instead, the various clocks are operated in the novel manner described below (the prior art mode has been described to clarify the differences in the instant system).

Analog Signal Processing

The output video voltage from the CCD undergoes signal conditioning in the form known as correlated double sampling (CDS). CDS is not required for the invention to perform, and other techniques (e.g. black level clamping) may be used to amplify and condition the signal.

A-D Conversion

The current implementation uses a Teledyne 4193 analog-to-digital converter to digitize the conditioned video signal to a precision of 12 bits for each selected summed pixel. The choice of A-D converter is not relevant to the invention.

Description of Operation

The prior art mode of operation (frame transfer) for CCD readout has been described above. In this section the current implementation of the method using the apparatus is disclosed.

The image area of the CCD is divided into one or more active groups (see FIG. 5), each group consisting of one or more adjacent rows of charges. Typically the majority of groups will contain 5-20 rows. It is desired to sum the charges from these groups into a single active row (using on-chip charge summation) for each group and digitize these active rows, while discarding or clearing the remaining rows of charges without digitizing them.

As previously mentioned, the human operator designates via keyboard entry to the computer those rows of charges which are to be divided into groups to be designated for digitizing. By default the remaining rows are designated as discard rows. The computer then loads the MCU microprogram memory with instructions to wait for the integration time to elapse and then provides electrical control signals to the clock drivers which actuate the CCD clock phases and gates to shift the rows of charge and sum, digitize and clear them.

In the current implementation, the groups of active rows and discard rows are each summed on-chip to form sets of single active summed rows and single discard summed rows. This summation takes place in the top row of the storage area. This is because the image area of the chip used has antiblooming structures which extend into the top row of the storage area, but not further thereinto. Summation into a row with antibloom capability is desirable because the total charges contained within columns of the rows being summed may exceed the pixel full-well capacity and otherwise bloom along the columns, hereby contaminating active rows with the bloomed charge.

It should be noted that other types of summation may be used; for example, the horizontal transport register may be used as the summing row.

In the current implementation, the readout sequence is programmed as follows;

(1) The MCU waits for the integration time to elapse. This accomplished by waiting for an exposure timer counter in the MCU to count the desired number of milliseconds.

(2) A set of 8 adjacent guard rows is created at the top of the storage area by clocking the storage area 8 times downward towards the horizontal transport register without clocking the image area. This creates 8 rows without any charge contained within them.

(3) If there are any rows of charge to be discarded in the image area between the active group closest to the storage area and the top of the storage area, then those rows are summed on chip into the top row of the storage area to create a summed discard row. This is accomplished by clocking the image area, without clocking the storage area, a number of times equal to the number of rows to be discarded.

(4) Otherwise, the first group of active rows starts at the first row (adjacent to the storage area) of the image area. In this case the group of active rows are summed together in a manner identical to (3) and the resulting summed row is designated as a summed active row.

Figure 6A:
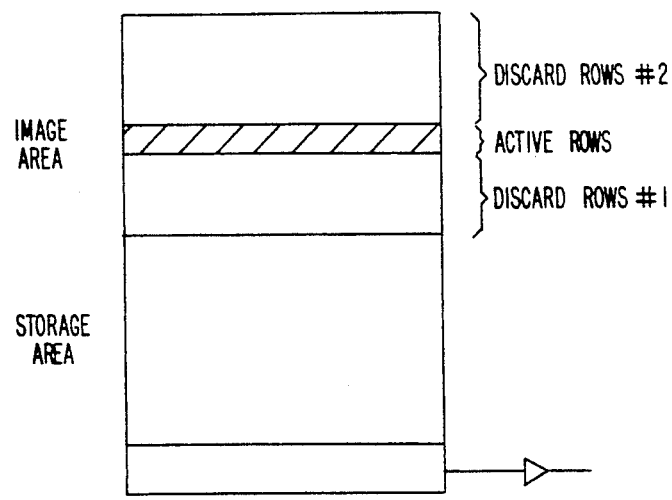
FIGS. 6(a) through 6(c) show a fanciful illustration representing the summation of rows on the chip.
Figure 6B:
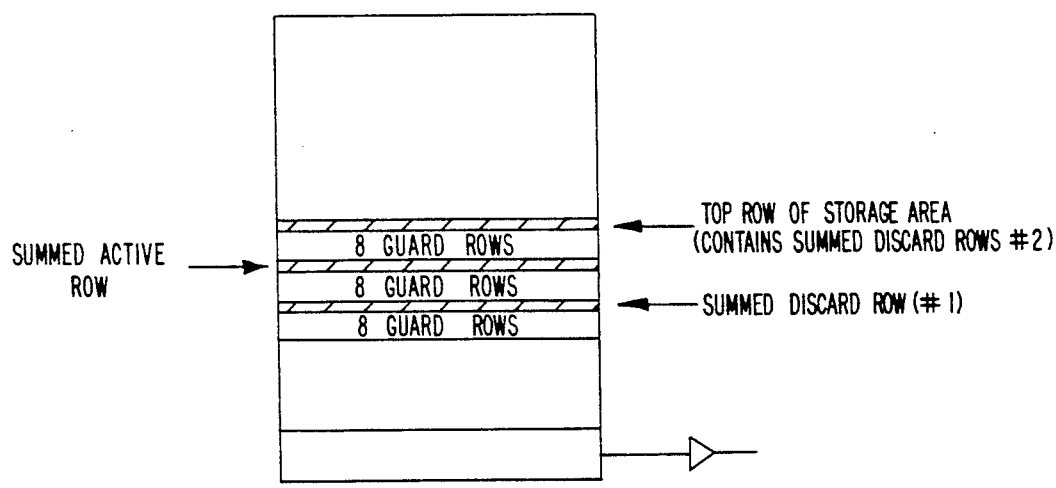

(5) The above steps (2)–(4) are repeated for as many active and discard groups as have been designated. FIG. 6a and 6b is an example that illustrates the locations of the rows of charges after steps (1) and (5). The reason that 8 guard rows are created between each summed row is that the antiblooming capability of the top row of the storage area is not completely effective for the specific CCD used in this implementation and a small amount of blooming has been observed which can be mitigated through creation of the guard rows.

(6) Once the last summed row (which may be active or discard) has been created in the top row of the storage area, a last set of 8 guard rows following it is created by clocking both the image area and storage area clocks 8 times. The image area is clocked in order to prevent residual bloomed charge from the last summation from contaminating the first rows of the next exposure.

(7) Now that all of the active summed rows, discard summed rows and guard rows are in the storage area, they are shifted down to the bottom of the storage area. This is accomplished by issuing as many storage area clock pulses as required to shift the first guard row from step (2) to the penultimate row of the storage area. (FIG. 5c)

(8) During the shifting process steps (2)–(7) there may be some dark current in the storage area (below the first guard row) which becomes summed into the horizontal transport register (HTR), even though the HTR clocks are actuated during the shifting process. These charges are cleared by shifting them through the output amplifier. Although this method of clearing/discarding the HRT is also used to dispose of the guard rows and summed discard rows, it may be accomplished in other ways (e.g. the HRT may have a gateable drain or perhaps all HTR phases and the reset transistor are actuated).

(9) As a small amount of blooming may have occurred from the dark current, the first row of the storage area is discarded by shifting the storage area down by one row and discarding that row.

(10) At this point the charges from the first guard row are in the first row of the storage area. The 8 guard rows are summed in groups of 2 into the HTR and discarded. This is accomplished by issuing 2 storage area clock pulses and then discarding the HTR. The mou has the capability of clocking the HTR at 4 times the rate at which it does when a row is being digitized.

(11) The first summed row (active or discard) is then shifted into the HTR by issuing a single storage area clock pulse. If it has been designated as a discard row the HTR is cleared; otherwise the HTR is shifted through the output amplifier one pixel at a time and the pixels are amplified and digitized.

(12) Steps (10) and (11) are repeated for as many sets of guard rows and summed rows as have been designated.

(13) Finally the trailing set of 8 guard rows are discarded as in step (10), and in the current implementation the entire process is repeated starting at step (1).

It should be noted that, in order for the summation process to work in the top row of the storage area, the storage area phase 3 clock should be held active (high) in order to create a potential well immediately adjacent to the bottom of the image area.

Scene Recovery Channel Method

The Scene Recovery Channel (SRC) uses the apparatus previously described to achieve the method and is effected by the selection of the Multi-Spectrometer Mode of operation. In this mode, full spectral resolution for a limited number of scene points, ("look directions") is achieved, and a full spatial resolution image at one wavelength (i.e. a single row) is also obtained, the latter being designated as the SRC. The SRC aids visual interpretation of the terrestrial surface swath being imaged so that features may be identified and correlated with the spectral information in the look directions.

Figure 6C:
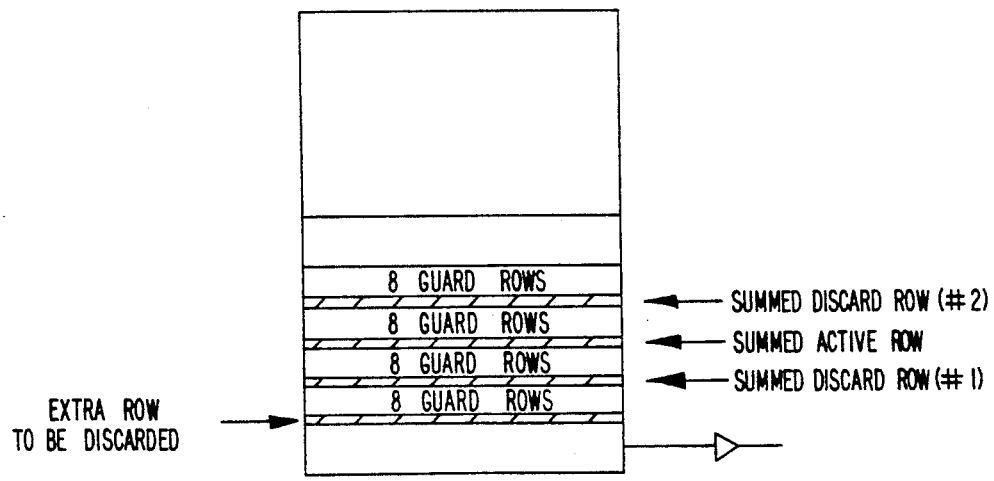

The detector format for multispectrometer mode is shown in FIG. 6. Each look direction includes a complete column of 288 rows. The Center Look column and Look Spacing (number of columns between look directions) may be selected by the human operator. One row is designated by the operator as the SRC and all of the pixels in that row are digitized. The pixels in the SRC that correspond to the look directions of the other rows may be extracted by software to "fill in" the gap in each look direction created by the readout of the SRC.

In the current implementation, the readout sequence is programmed as follows:

(1) The MCU waits for the integration time to elapse.

(2) The Image Area is shifted into the Storage Area by clocking both areas 290 times.

(3) The Storage Area is shifted down one row into the HTR. If the row has been designated as the SRC, then all of the 578 pixels in the row are digitized. If the row has instead been designated as a Look Direction Row, it is shifted through the output amplifier but only the Look Direction pixels are digitized. The pixels between Look Directions are discarded by shifting them at 4 times the rate at which pixels are shifted when they are digitized.

(4) Step (3) is repeated until all of the rows in the Storage Area have been transferred into the HTR and shifted through the output amplifier.

(5) The above process is repeated continuously, starting at step (1), as long as the operator wishes to collect data.

The embodiments of the invention in which an exclusive property or privilege is claimed are defined as follows:

1. In a method wherein rows of charges are generated, by exposure to light, in an array of pixels forming part of a two dimensional charge transfer sensor which is coupled by a transport register with an output amplifier, and charges are transferred from the sensor by the register to the output amplifier for digitization thereby, the improvement comprising:

dividing the rows of charges, generated in the array by an exposure, into groups, the majority of the groups each having several adjacent rows of charges;

designating some of the groups for digitization and the balance of the groups for clearing without digitization;

summing within the sensor the charges of the rows in each group to be digitized to produce an active summed row of charges for each such group;

sequentially transferring the active summed rows to be digitized to the output amplifier;

individually digitizing the charges of each such transferred active summed row to provide signal values for collection; and clearing the balance of the rows of charges from the sensor without digitizing them.

2. In a method wherein rows of charges are generated, by exposure to light, in an array of pixels forming part of a two dimensional charge transfer sensor which is coupled by a transport register with an output amplifier, and charges are transferred from the sensor by the register to the output amplifier for digitization thereby, the improvement comprising:

dividing the rows of charges, generated in the array by an exposure, into groups, the majority of the groups each having several adjacent rows of charges;

designating some of the groups for digitization and the balance of the groups for clearing without digitization;

summing within the sensor the charges of the rows in each group to be digitized to produce an active summed row of charges for each such group;

summing within the sensor the charges of the rows in each group to be cleared without digitization to produce a discard summed row of charges for each such group;

sequentially transferring the active summed rows to the output amplifier;

individually digitizing the charges of each such transferred active summed row to provide signal values for collection; and clearing the discard summed rows of charges from the sensor without digitizing them.

3. The improvement as set forth in claim 2 comprising:

sequentially transferring the discard summed rows to the output amplifier; and using the output amplifier to clear the discard summed rows from the sensor without digitizing them.

4. The improvement as set forth in claim 1 comprising:

providing at least part of the sensor with antiblooming capability; and utilizing the section of the sensor having the antiblooming capability for summing the individual groups.

5. The improvement as set forth claim 2 comprising:

providing at least part of the sensor with antiblooming capability; and utilizing the section of the sensor having the antiblooming capability for summing the individual groups.

6. The improvement as set forth in claim 3 comprising:

providing at least part of the sensor with antiblooming capability; and utilizing the section of the sensor having the antiblooming capability for summing the individual groups.

7. In a method wherein a pushbroom spectrographic imager is flown over a scene and a charge coupled device chip forming the sensor of the imager is momentarily exposed to and actuated by light reflected from a swath of the scene, said chip having an array of pixels arranged in rows and columns divided into active and storage areas, said chip comprising a transport register located at the end of the storage area remote from the active area, said register forming part of the storage area, said register being coupled with an output amplifier whereby charges may be transferred from the chip to the output amplifier for digitization thereby, the improvement comprising:

utilizing a chip having antiblooming structure located in the storage area;

dividing the rows of charges, generated in the array by an exposure, into groups, each such group consisting of several adjacent rows of charges;

designating some of the groups for digitization and the balance of the groups for clearing without digitization;

summing within the chip the charges of the rows in each group to be digitized to produce an active summed row of charges for each such group;

summing within the chip the charges of the rows in each group to be cleared without digitization to produce a discard summed row of charges for each such group;

sequentially transferring the active summed rows to the output amplifier;

individually digitizing the charges of each such transferred active summed row to provide signal values for collection; and clearing the discard summed rows of charges from the sensor without digitizing them.

8. The improvement as set forth in claim 7 comprising:

sequentially transferring the discard summed rows to the output amplifier; and using the output amplifier to clear the discard summed rows from the sensor without digitizing them.

9. In a method wherein a pushbroom spectrographic imager is flown over a scene and a charge coupled device chip forming the sensor of the imager is momentarily exposed to and actuated by light reflected from a swath of the scene, said chip having an array of pixels arranged in rows and columns divided into active and storage areas, said chip comprising a transport register located at the end of the storage area remote from the active area, said register forming part of the storage area, said register being coupled with an output amplifier whereby charges may be transferred from the chip to the output amplifier for digitization thereby, the improvement comprising:

designating at least one of the rows of charges for digitization in whole or in part;

designating at least one of the columns of charges for digitization in whole or in part;

transferring the row or rows of charges to be digitized to the output amplifier and digitizing part or all of the charges;

transferring the balance of the rows to the amplifier and digitizing only those charges in each such row corresponding with the designated columns; and clearing the balance of the charges without digitization;

whereby signal values for collection are provided which yield both spatial and spectral line image information from a single exposure.

* * * * *